US011742429B2

(12) United States Patent
Sharma et al.

(10) Patent No.: US 11,742,429 B2
(45) **Date of Patent: *Aug. 29, 2023**

(54) THIN-FILM TRANSISTORS WITH LOW CONTACT RESISTANCE

(71) Applicant: Intel Corporation, Santa Clara, CA (US)

(72) Inventors: Abhishek A. Sharma, Portland, OR (US); Van H. Le, Portland, OR (US); Li Huey Tan, Beaverton, OR (US); Tristan A. Tronic, Aloha, OR (US); Benjamin Chu-Kung, Boise, ID (US); Jack T. Kavalieros, Portland, OR (US); Tahir Ghani, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/508,843

(22) Filed: Oct. 22, 2021

(65) Prior Publication Data

US 2022/0045220 A1 Feb. 10, 2022

Related U.S. Application Data

(63) Continuation of application No. 16/647,679, filed as application No. PCT/US2018/013181 on Jan. 10, 2018, now Pat. No. 11,189,733.

(51) Int. Cl.
*H01L 29/786* (2006.01)
*H01L 29/06* (2006.01)
(Continued)

(52) U.S. Cl.
CPC .... *H01L 29/78681* (2013.01); *H01L 29/0669* (2013.01); *H01L 29/20* (2013.01); *H01L 29/42384* (2013.01); *H01L 29/66742* (2013.01)

(58) Field of Classification Search
CPC .......... H01L 29/78681; H01L 29/0669; H01L 29/20; H01L 29/42384; H01L 21/8258;
(Continued)

(56) References Cited

U.S. PATENT DOCUMENTS

| | | | | |
|---|---|---|---|---|
| 9,236,490 B2 * | 1/2016 | Yamazaki | ......... | H01L 29/78696 |
| 2005/0099551 A1 * | 5/2005 | Yang | .................... | G02F 1/1368<br>349/43 |

(Continued)

FOREIGN PATENT DOCUMENTS

| | | |
|---|---|---|
| WO | WO 2012022935 | 2/2012 |
| WO | WO 2016148460 | 9/2016 |
| WO | WO 2019139577 | 7/2019 |

OTHER PUBLICATIONS

Nawaz, et al., "Poly (Vinyl Alcohol) Gate Dielectric Treated With Anionic Surfactant in C60 Fullerene-Based n-Channel Organic Field Effect Transistors", Material Research, 2016; 19(5), Sep. 2016, pp. 1201-1206.

(Continued)

*Primary Examiner* — Shahed Ahmed
(74) *Attorney, Agent, or Firm* — Schwabe, Williamson & Wyatt, P.C.

(57) ABSTRACT

Techniques are disclosed for forming thin-film transistors (TFTs) with low contact resistance. As disclosed in the present application, the low contact resistance can be achieved by intentionally thinning one or both of the source/drain (S/D) regions of the thin-film layer of the TFT device. As the TFT layer may have an initial thickness in the range of 20-65 nm, the techniques for thinning the S/D regions of the TFT layer described herein may reduce the thickness in one or both of those S/D regions to a resulting thickness of 3-10 nm, for example. Intentionally thinning one or both of the S/D regions of the TFT layer induces more electrostatic charges inside the thinned S/D region, thereby increasing the (Continued)

effective dopant in that S/D region. The increase in effective dopant in the thinned S/D region helps lower the related contact resistance, thereby leading to enhanced overall device performance.

20 Claims, 9 Drawing Sheets

(51) Int. Cl.
*H01L 29/20* (2006.01)
*H01L 29/423* (2006.01)
*H01L 29/66* (2006.01)

(58) Field of Classification Search
CPC ............. H01L 27/0688; H01L 29/7869; H01L 29/78618; H01L 29/66742–6678; H01L 29/786–78696; H01L 27/12–13; H01L 29/04–045
See application file for complete search history.

(56) References Cited

U.S. PATENT DOCUMENTS

2006/0008932 A1* 1/2006 Oh ...................... G02F 1/13454 438/34
2010/0264420 A1 10/2010 Honda
2014/0159035 A1 6/2014 Park et al.
2017/0170029 A1* 6/2017 Ochi ................... C23C 14/5806
2019/0288118 A1* 9/2019 Song ................. H01L 29/66742

OTHER PUBLICATIONS

International Search Report and Written Opinion received for PCT Application No. PCT/US2018/013181 dated Oct. 10, 2018. 13 pages.
International Preliminary Report on Patentability received for PCT Application No. PCT/US2018/013181 dated Jul. 23, 2020, 10 pages.

* cited by examiner

THIN-FILM TRANSISTORS WITH LOW CONTACT RESISTANCE

CROSS-REFERENCE TO RELATED APPLICATION

This patent application is a continuation of U.S. patent application Ser. No. 16/647,679, filed Mar. 16, 2020, which is a U.S. National Phase Application under 35 U.S.C. § 371 of International Application No. PCT/US2018/013181, filed Jan. 10, 2018, entitled "THIN-FILM TRANSISTORS WITH LOW CONTACT RESISTANCE," which designates the United States of America, the entire disclosures of which are hereby incorporated by reference in their entirety and for all purposes.

BACKGROUND

A thin-film transistor (TFT) is a type of field-effect transistor (FET) that generally includes a thin film or layer used at least for the channel of the device. A FET, and thus a TFT, is a semiconductor device that includes three terminals: a gate, a source, and a drain. A FET, and thus a TFT, uses an electric field applied by the gate to control the electrical conductivity of a channel through which charge carriers (e.g., electrons or holes) flow between the source and drain. In instances where the charge carriers are electrons, the transistor may be referred to as an n-channel device, and in instances where the charge carriers are holes, the transistor may be referred to as a p-channel device.

Figure 1:
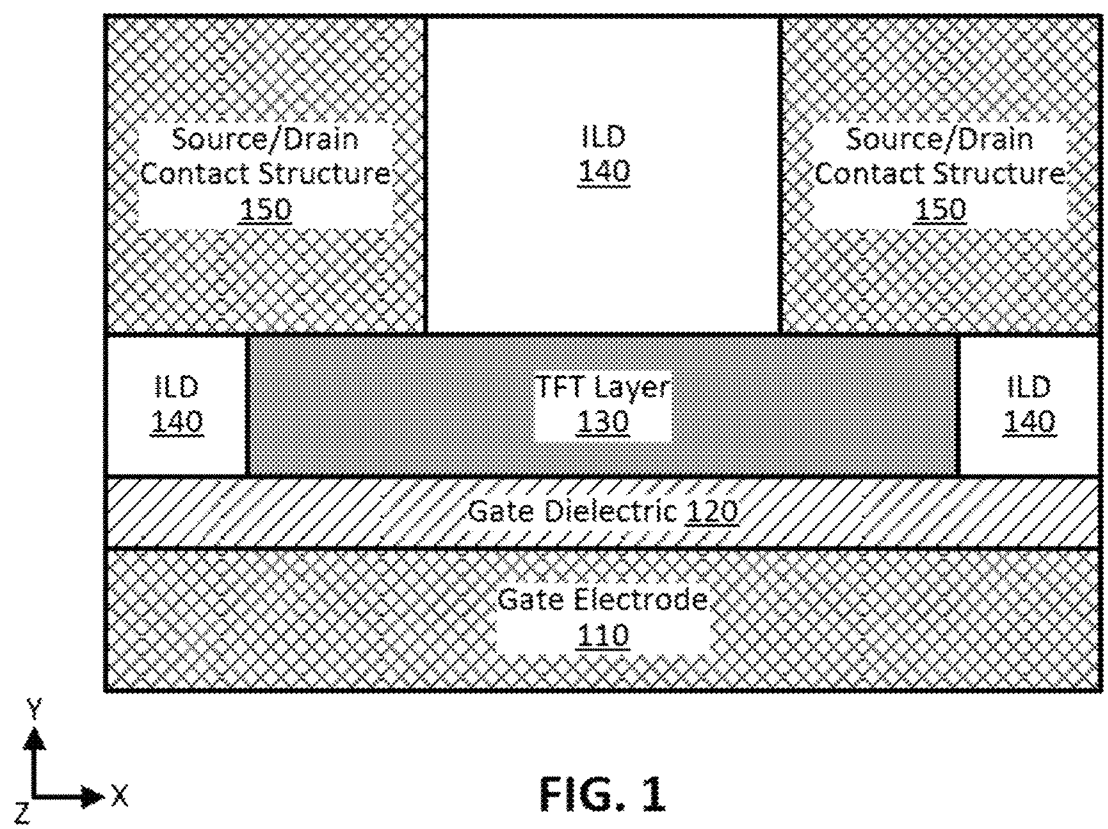
FIG. 1 illustrates an example back-gated or bottom-gated thin-film transistor (TFT) device.

These and other features of the present embodiments will be understood better by reading the following detailed description, taken together with the figures herein described.

In the drawings, each identical or nearly identical component that is illustrated in various figures may be represented by a like numeral. For purposes of clarity, not every component may be labeled in every drawing. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles, and some features may have surface topography or otherwise be non-smooth, given real-world limitations of fabrication processes. Further still, some of the features in the drawings may include a patterned and/or shaded fill, which is merely provided to assist in visually identifying the different features. In short, the figures are provided merely to show example structures.

DETAILED DESCRIPTION

In some cases, a thin-film transistor (TFT) may be formed with a back-gated or bottom-gated architecture, where the gate structure is first formed and then the thin film or TFT layer is formed over that gate structure. In addition, back-gated TFTs typically include source and drain contacts that are over the back-gated structure, as opposed to other TFTs where the gate structure is only between the source and drain contacts, for example. For instance, FIG. 1 illustrates such a back-gated or bottom-gated TFT architecture, where the TFT layer 130 is over the gate structure, which includes gate electrode 110 and gate dielectric 120 in this example illustration. As can be understood, the channel region of the TFT device is located in TFT layer 130. Further, source/drain contact structures 150 are also over the gate structure, with interlayer dielectric (ILD) material 140 present to help electrically isolate the features of the TFT device, as shown. TFTs with back-gated architecture have a unique way of increasing dopants beneath the source and drain contacts by application of the gate field. However, TFTs with back-gated architecture can suffer from contact resistance issues, such as high external resistance (Rext), particularly where the TFT layer thickness in the source and drain regions is relatively thick. Some techniques for reducing Rext for back-gated TFTs include the creation of oxygen vacancies by implants and reactive metals. However, there is further need to lower contact resistances and Rext for back-gated TFTs.

Thus, and in accordance with various embodiments of the present disclosure, techniques are provided for forming TFTs with low contact resistance. In some embodiments, the low contact resistance and lower Rext is achieved by intentionally thinning one or both of the source and drain (S/D) regions of the TFT layer of a TFT device. As can be understood based on this disclosure, the TFT layer is the layer in which the channel region of the TFT resides. As the TFT layer may have an initial thickness, in some embodiments, in the range of 10-100 nanometers (nm) (or in a sub-range of 20-65 nm), the techniques for thinning the S/D regions or portions of the TFT layer described herein may reduce the thickness in one or both of those S/D regions by at least 5-80 nm (or in a sub-range of 5-50 nm), for example. In other words, the thinned S/D regions may have a resulting thickness in the range of 2-20 nm (or in a sub-range of 3-5 nm). For instance, if the initial thickness of the TFT layer is 20 nm, then it may be thinned down to 5 nm in one or both of the S/D regions using the techniques described herein. In general, intentionally thinning one or both of the S/D regions of the TFT layer as described herein induces more electrostatic charges inside the thinned S/D region, thereby increasing the effective dopant in that S/D region. The increase in effective dopant in the thinned S/D region helps lower the related contact resistance, which reduces Rext for the back-gated TFT device, thereby leading to enhanced overall transistor performance. Other benefits of the techniques and structures described herein will be apparent in light of this disclosure.

Note that the use of "source/drain" or "S/D" herein is simply intended to refer to a source region or a drain region or both a source region and a drain region. To this end, the forward slash ("/") as used herein means "and/or" unless otherwise specified, and is not intended to implicate any particular structural limitation or arrangement with respect to source and drain regions, or any other materials or features that are listed herein in conjunction with a forward slash.

In some embodiments, the techniques for thinning the TFT layer in the S/D regions may be achieved by first etching S/D contact trenches in interlayer dielectric (ILD) material above the TFT layer, followed by etching the TFT layer in the exposed S/D regions to a desired thickness as variously described herein. For instance, in some embodiments, a controlled etch (e.g., a timed wet or dry etch) may be used to remove a portion of the TFT layer in the S/D regions, leaving a relatively thinner portion of the TFT layer as compared to the portion of the TFT layer between the S/D regions (e.g., in the channel region). In some embodiments, a multilayer TFT layer may be employed, where the TFT layer includes two or more sub-layers having different material compositions. Further, in some such cases, if the different material compositions of the TFT sub-layers allow for selective etching, selective etch processing may be utilized to remove one or more of the upper-most sub-layers (or those first exposed via the S/D contact trench) while the one or more remaining bottom-most sub-layers act as an etch stop (or at least an etch slow down mechanism) to control the thinning process. Note that in some such cases, perfect or even high etch selectivity need not be required between the one or more upper-most sub-layers to be removed and the remaining bottom-most sub-layers desired to be maintained, as even low relative etch selectivity may provide enhanced control for thinning the TFT layer in the S/D regions, as can be understood based on this disclosure.

In some embodiments, the thinning of TFT S/D regions described herein may be symmetrical, such that the thinning is the same or substantially similar in each of the S/D regions. For instance, in some such embodiments, the resulting thickness of source region (or the portion of the TFT layer between the source contact structure and the gate structure) may be substantially similar to the resulting thickness of the drain region (or the portion of the TFT layer between the drain contact structure and the gate structure) such that the two resulting thicknesses are within 1 or 2 nm of each other. However, in other embodiments, the thinning of TFT S/D regions described herein may be asymmetrical, such that one S/D region is thinned and the other is not, or such that one S/D region is thinned relatively more than the other S/D region, such as greater than 2 nm more, for example. For instance, in such an asymmetrical configuration, starting with an initial TFT layer having a thickness of 20 nm, one S/D region may be thinned down to 5 nm, while the other may be thinned down to 8 nm, to provide an example. Note that the thicknesses referred to herein for a feature may be the thickness at a distinct location for the feature (e.g., the thickness at the center of an S/D region or portion of the TFT layer), the maximum thickness of the feature (e.g., of an S/D region or portion of the TFT layer), and/or the average thickness of the feature (e.g., the average thickness of a given S/D region or portion of the TFT layer).

In some embodiments, the TFT layer may include at least one metal oxide, such as indium gallium zinc oxide (referred to as IGZO), gallium oxide, indium oxide, indium zinc oxide, indium tin oxide, copper oxide, zinc oxide, and/or zinc tin oxide, to name a few examples. In some such embodiments, the metal oxide material (which in some cases may also be considered a semiconducting material, and more specifically, an oxide semiconductor material) may have a single crystal or monocrystalline (or simply, crystalline) structure (e.g., crystalline IGZO), an amorphous crystalline structure (e.g., amorphous IGZO), or a crystalline structure in between that may be referred to as a polycrystalline structure (e.g., polycrystalline IGZO). Further, in some such embodiments, the metal oxide material may have other type of crystalline structures, such as a C-axis aligned crystalline (CAAC) structure (e.g., CAAC IGZO) or a nanocrystalline structure (e.g., nanocrystalline IGZO). Note that these other type of crystalline structures may be well suited for production purposes because of their relatively low thermal budget requirements (that can be suitable with back-end-of-line processing, such as thermal budgets of 400-600 degrees Celsius), relatively low cost, relatively high throughput, and relatively high reliability.

In some embodiments, the TFT layer may include amorphous, polycrystalline, or monocrystalline group IV and/or group III-V semiconductor material, such as silicon, germanium, silicon germanium, gallium arsenide, or indium gallium arsenide, to name a few examples. In some such embodiments, the group IV and/or group III-V semiconductor material, where employed may be grown at low temperatures, particularly at back-end-of-line (BEOL) IC locations. Note that the use of "group IV semiconductor material" (or "group IV material" or generally, "IV") herein includes at least one group IV element (e.g., silicon, germanium, carbon, tin), such as silicon (Si), germanium (Ge), silicon germanium (SiGe), and so forth. The use of "group III-V semiconductor material" (or "group III-V material" or generally, "III-V") herein includes at least one group III element (e.g., aluminum, gallium, indium) and at least one group V element (e.g., nitrogen, phosphorus, arsenic, antimony, bismuth), such as gallium arsenide (GaAs), indium gallium arsenide (InGaAs), indium aluminum arsenide (InAlAs), gallium phosphide (GaP), gallium antimonide (GaSb), indium phosphide (InP), and so forth. Note that group III may also be known as the boron group or IUPAC group 13, group IV may also be known as the carbon group or IUPAC group 14, and group V may also be known as the nitrogen family or IUPAC group 15, for example.

In some embodiments, the composition of one or more materials within the TFT layer may be graded (e.g., increased and/or decreased), as desired. For example, in some such embodiments, the composition of a first material included in the TFT layer may be increased going up the thickness of the TFT layer, while the composition of a second material included in the TFT layer may be decreased. To provide a more specific example, if the TFT layer includes graded IGZO, the bottom of the TFT layer (nearest the gate structure) may include a relatively high indium concentration which is decreased along the thickness of the TFT layer, such that the top of the TFT layer includes a relatively lower indium concentration. Further, in such a specific example, the gallium and/or zinc concentration included in the graded TFT layer may increase moving along the thickness of the TFT layer, such that the gallium and/or zinc concentration is relatively lowest near the gate structure and relatively highest farthest from the gate structure. Numerous variations and configurations for the TFT layer will be apparent in light of this disclosure.

Note that, as used herein, the expression "X includes at least one of A or B" refers to an X that may include, for example, just A only, just B only, or both A and B. To this end, an X that includes at least one of A or B is not to be understood as an X that requires each of A and B, unless expressly so stated. For instance, the expression "X includes A and B" refers to an X that expressly includes both A and B. Moreover, this is true for any number of items greater than two, where "at least one of" those items is included in X. For example, as used herein, the expression "X includes at least one of A, B, or C" refers to an X that may include just A only, just B only, just C only, only A and B (and not C), only A and C (and not B), only B and C (and not A), or each of A, B, and C. This is true even if any of A, B, or C happens to include multiple types or variations. To this end, an X that includes at least one of A, B, or C is not to be understood as an X that requires each of A, B, and C, unless expressly so stated. For instance, the expression "X includes A, B, and C" refers to an X that expressly includes each of A, B, and C. Likewise, the expression "X included in at least one of A or B" refers to an X that may be included, for example, in just A only, in just B only, or in both A and B. The above discussion with respect to "X includes at least one of A or B" equally applies here, as will be appreciated.

Use of the techniques and structures provided herein may be detectable using tools such as: electron microscopy including scanning/transmission electron microscopy (SEM/TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDX); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. In particular, in some embodiments, such tools may indicate an IC including at least one TFT device, where the TFT includes a TFT layer having at least one S/D region that is relatively thinner than the channel region of the TFT layer, as variously described herein. The at least one relatively thinner portion in the S/D region(s) may be detectable via electron microscopy (e.g., SEM and/or TEM), for example. In some embodiments, the techniques described herein may be detected based on the benefits derived therefrom, such as the inducement of more electrostatic charges inside the thinned S/D region(s) of the TFT device, thereby leading to low contact resistance and improved device performance, for example. Numerous configurations and variations will be apparent in light of this disclosure.

Architecture and Methodology

Figure 2:
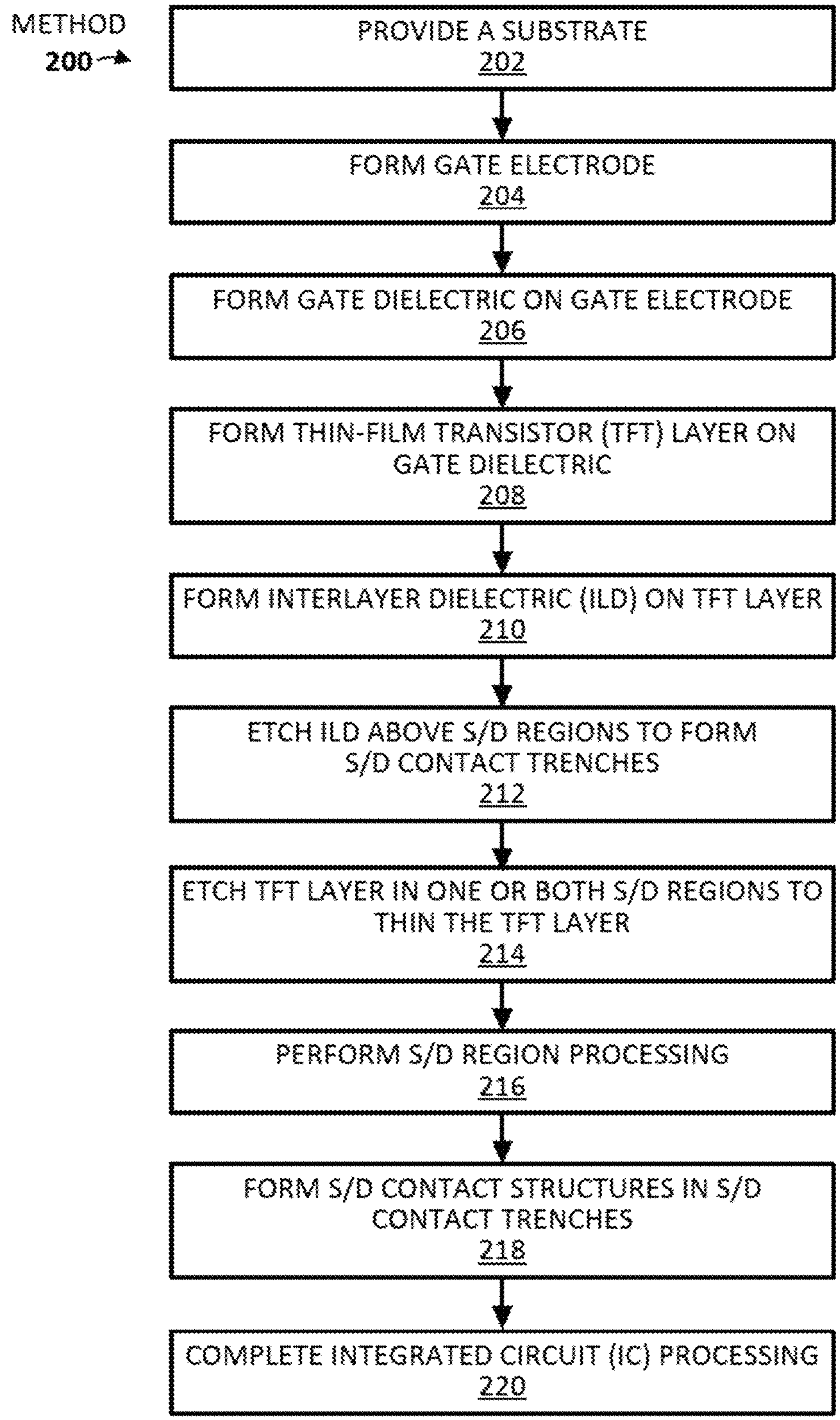
FIG. 2 illustrates a method of forming an integrated circuit (IC) including at least one back-gated TFT with at least one relatively thinned source/drain (S/D) region, in accordance with some embodiments of the present disclosure.

FIG. 2 illustrates method 200 of forming an integrated circuit (IC) including at least one back-gated TFT with at least one relatively thinned S/D region, in accordance with some embodiments of the present disclosure. FIGS. 3A-3F illustrate cross-sectional views of example IC structures formed when carrying out method 200 of FIG. 2, in accordance with some embodiments. As can be understood based on this disclosure, by thinning an S/D region of a back-gated TFT, the thinned S/D region induces more electrostatic charge inside the S/D regions due to the corresponding S/D contact being closer to the back-gate structure, which results in increased effective dopant in the thinned S/D region, thereby lowering S/D resistance and benefitting overall device performance. Note that although method 200 of FIG. 2 and the IC structures of FIGS. 3A-3F are illustrated and described herein in the context of a back-gated or bottom-gated TFT architecture, the techniques can be applied to form a front-gated or top-gated TFT architecture, where method 200 and the resulting TFT device would essentially be inverted relative to what is shown and described (e.g., form the S/D contact structures first, then the TFT layer, then the gate structure). However, in any such case, the TFT devices described herein include an overlap of at least one S/D contact structure with the gate structure, where thinning the S/D region therebetween induces more electrostatic charge inside that S/D region, as previously stated. Numerous variations and configurations will be apparent in light of this disclosure.

Method 200 of FIG. 2 includes providing 102 a substrate and forming the gate structure, which includes forming 204 a gate electrode and forming 206 a gate dielectric on the gate electrode, in accordance with some embodiments. The substrate upon which the gate structure is formed may be any suitable substrate, as will be described in more detail herein (e.g., with reference to substrate 301 in FIG. 8). In some embodiments, the substrate may be: a bulk substrate including group IV semiconductor material, such as silicon (Si), germanium (Ge), silicon germanium (SiGe), or silicon carbide (SiC), group III-V semiconductor material, and/or any other suitable material(s) as will be apparent in light of this disclosure; an X on insulator (XOI) structure where X is one of the aforementioned materials (e.g., group IV and/or group III-V semiconductor material) and the insulator material is an oxide material or dielectric material or some other electrically insulating material, such that the XOI structure includes the electrically insulating material layer between two semiconductor layers; or some other suitable multilayer structure where the top layer includes one of the aforementioned semiconductor materials (e.g., group IV and/or group III-V semiconductor material). In some embodiments, the substrate may be an insulator or dielectric substrate, such as a glass substrate. In some embodiments, the substrate may be used for one or more other IC devices, such as various diodes (e.g., light-emitting diodes (LEDs) or laser diodes), various transistors (e.g., MOSFETs or TFETs), various capacitors (e.g., MOSCAPs), various microelectromechanical systems (MEMS), various nanoelectromechanical systems (NEMS), various radio frequency (RF) devices, various sensors, or any other suitable semiconductor or IC devices, depending on the end use or target application. Accordingly, in some embodiments, the structures described herein may be included in a system-on-chip (SoC) application, as will be apparent in light of this disclosure. Numerous suitable substrate configurations will be apparent in light of this disclosure.

Figure 8:
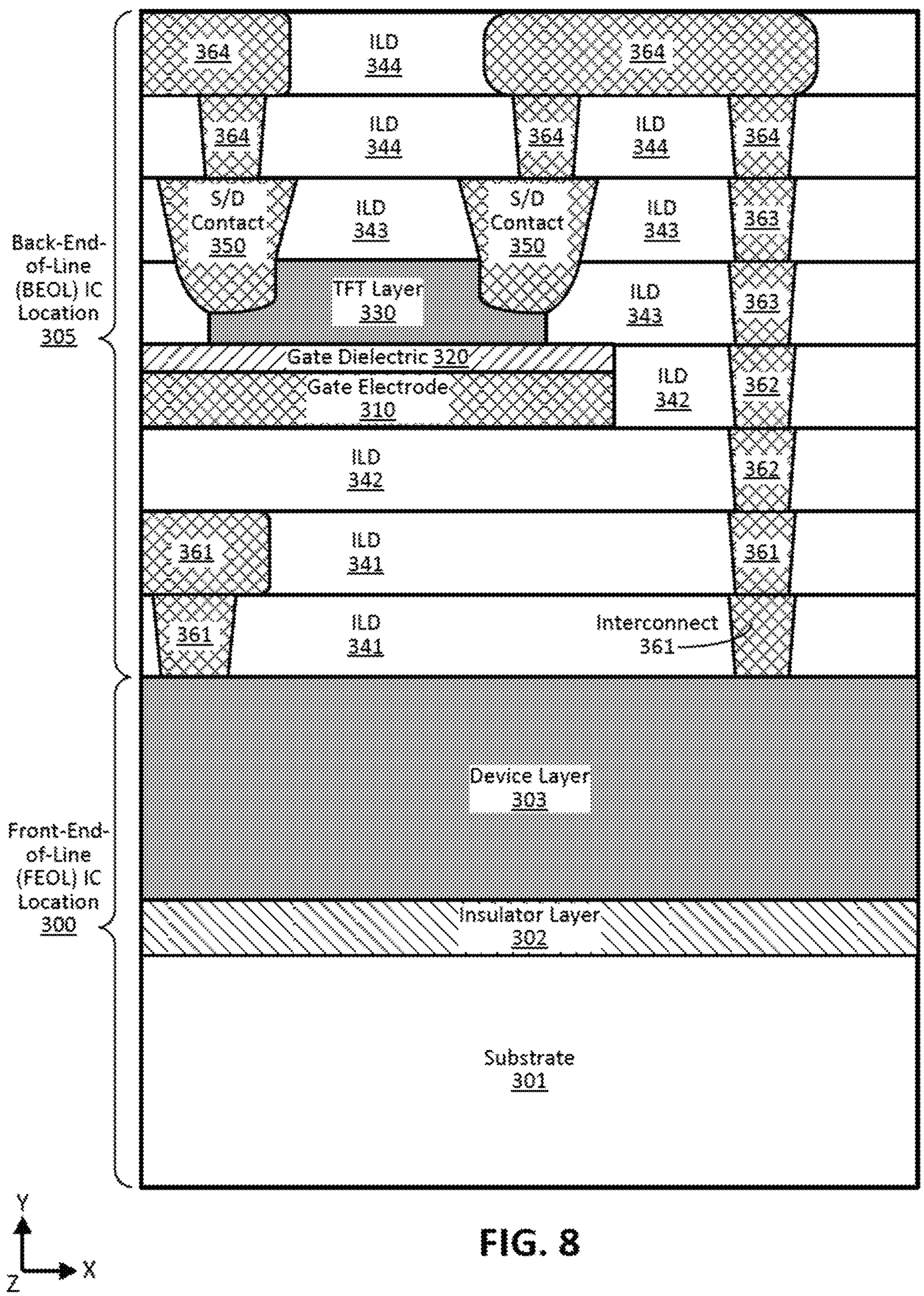
FIG. 8 illustrates a cross-sectional view of an example IC structure including a back-gated TFT device including thinned S/D regions at a back-end-of-line (BEOL) IC location, in accordance with some embodiments of the present disclosure.

In some embodiments, the back-gated TFT structures shown being formed in FIGS. 3A-3F may be formed at a back-end-of-line IC location (e.g., as shown in FIG. 8), while in other embodiments, the back-gated TFT structures may be formed at a front-end-of-line IC location (e.g., in device layer 303 in FIG. 8). The variations on the location of the back-gated TFT structure formed using the techniques described herein will be described in more detail with reference to FIG. 8. However, the substrate provided at block 102 (e.g., substrate 301 in FIG. 8) is not shown in FIGS. 3A-3F for ease of illustration. Regardless of whether gate electrode 310 is formed at a back-end-of-line or frontend-of-line IC location, in some embodiments, it may be formed directly on dielectric material, such as on oxide material (e.g., silicon dioxide), nitride material (e.g., silicon nitride), and/or any other suitable dielectric material. In the example structure of FIG. 3A, gate electrode 310 has been formed 204 and gate dielectric 320 was formed thereon, and in this case, above the gate electrode 310, in accordance with some embodiments. Gate electrode 310 and gate dielectric 320 may be formed using any suitable processing, such as chemical vapor deposition (CVD), physical vapor deposition (PVD), atomic layer deposition (ALD), sputtering, and/or any other suitable technique as can be understood based on this disclosure. Further note that the gate electrode 310 and gate dielectric 320 may be blanket deposited on at least a portion of the IC or selectively deposited on only a portion of the IC (e.g., by masking off areas where the gate structure is not desired).

Gate electrode 310, in some embodiments, may include a wide range of materials, such as various suitable metals or metal alloys, such as one or more of aluminum (Al), tungsten (W), titanium (Ti), tantalum (Ta), copper (Cu), nickel (Ni), gold (Au), platinum (Pt), ruthenium (Ru), or cobalt (Co), and/or carbides thereof and/or nitrides thereof, for example. Thus, in some embodiments, gate electrode 310 may include one or more metals and may or may not include one or more other materials (such as carbon and/or nitrogen). In some embodiments, gate electrode 310 may include a multilayer structure, including two or more compositionally distinct layers. For instance, in some such embodiments, one or more work function layers may be employed, such as one or more metal including layers (e.g., tantalum nitride or titanium nitride) that are formed with desired electrical characteristics based on the given configuration. For example, in some such embodiments, the thickness, material, and/or deposition process of sub-layers within a multilayer gate electrode may be selected based on a target application. In some embodiments, when forming a back-gated TFT device at a back-end-of-line IC location, such that the device is formed in one or more metallization lines/layers where interconnects and/or metal wiring are typically located, then the gate electrode 310 may be formed when forming a metal layer, such as metal layer 1 (M1), metal layer 2 (M2), metal layer 3 (M3), and so forth. However, if the back-gated TFT device were formed at a front-end-of-line IC location, which is where IC devices are typically formed, then the gate electrode 310 may be formed on an insulator layer, such as a buried oxide layer (e.g., silicon dioxide) which may be a part of a silicon or semiconductor-on-insulator configuration.

In some embodiments, gate electrode 310, may have any suitable height/thickness (dimension in the Y-axis direction), such as a thickness in the range of 10-100 nm (or in a sub-range of 10-25, 10-50, 10-75, 20-30, 20-50, 20-75, 20-100, 30-50, 30-75, 30-100, 50-75, or 50-100 nm), for example, or within any other suitable range as will be apparent in light of this disclosure. In some such embodiments, the gate electrode 310 thickness may fall within the sub-range of 20-40 nm. In some embodiments, the height/thickness of gate electrode 310 may be expressed based on a threshold value, such as the gate electrode 310 having a thickness of at most 50, 40, 30, 25, 20, 15, or 10 nm, and/or a thickness of at least 10, 15, 20, 25, 30, 40, or 50 nm, for example. In some embodiments, the height/thickness of the gate electrode 310 may be determined, at least in part, based on the location of where it is formed. For instance, in some such embodiments, if the gate electrode 310 is being formed in a metallization line (such as M2), the maximum height/thickness of that metallization line may dictate the maximum height/thickness of the gate electrode 310, to provide an example. In some embodiments, gate electrode 310 may include grading (e.g., increasing and/or decreasing) the content/concentration of one or more materials through at least a portion of the gate electrode 310. Numerous variations and configurations for gate electrode 310 will be apparent in light of this disclosure.

Gate dielectric 320, in some embodiments, may include any suitable oxide (such as silicon dioxide), high-k dielectric material, low-k dielectric material, and/or any other suitable material as will be apparent in light of this disclosure. Examples of high-k dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, to provide some examples. Thus, in some embodiments, gate dielectric 320 may include oxygen and one or more other materials, such as hafnium and oxygen, which may be in the form of hafnium oxide or hafnia. In some embodiments, gate dielectric 320 may include nitrogen and one or more materials, such as silicon and nitrogen, which may be in the form of silicon nitride. In some embodiments, the gate dielectric 320 may include one or more silicates (e.g., titanium silicate, tungsten silicate, niobium silicate, and silicates of other transition metals). In some embodiments, an annealing process may be carried out on the gate dielectric 320 to improve its quality when high-k dielectric material is used. In some embodiments, gate dielectric 320 may include a multilayer structure, including two or more compositionally distinct layers. For example, a multilayer gate dielectric may be employed to obtain desired electrical isolation and/or to help transition from the gate electrode 310 to the TFT layer 330, in accordance with some embodiment.

In some embodiments, gate dielectric 320, may have any suitable height/thickness (dimension in the Y-axis direction), such as a thickness in the range of 1-30 nm (or in a sub-range of 1-5, 1-10, 1-15, 1-20, 1-25, 2-5, 2-10, 2-15, 2-20, 2-25, 2-30, 5-10, 5-15, 5-20, 5-25, 5-30, 10-20, 10-30, or 20-30 nm), for example, or within any other suitable range as will be apparent in light of this disclosure. In some such embodiments, the gate dielectric 320 thickness may fall within the sub-range of 2-10 or 5-10 nm. In some embodiments, the height/thickness of gate dielectric 320 may be expressed based on a threshold value, such as the gate dielectric 320 having a thickness of at most 30, 25, 20, 15, 10, or 5 nm, and/or a thickness of at least 2, 5, 10, 15, 20, or 25 nm, for example. In some embodiments, the height/thickness of the gate dielectric 320 may be determined, at least in part, based on the location of where it is formed. For instance, in some such embodiments, if the gate dielectric 320 is being formed in a metallization line (such as M2), the maximum height/thickness of that metallization line may dictate the maximum height/thickness of the gate dielectric 320, to provide an example. In some embodiments, gate dielectric 320 may include grading (e.g., increasing and/or decreasing) the content/concentration of one or more materials through at least a portion of the gate dielectric 320.

In some embodiments, the characteristics of gate dielectric 320 may be selected based on desired electrical properties. For instance, some embodiments may employ a relatively thicker gate dielectric (e.g., at least 5 or 10 nm in thickness) and/or relatively lower-k dielectric material for the gate dielectric, such as silicon dioxide or low-k dielectric material (where the dielectric constant, k, is less than that of silicon dioxide, so less than 3.9). Low-k dielectric material may include fluorine-doped silicon dioxide, carbon-doped silicon dioxide, porous silicon dioxide, porous carbon-doped silicon dioxide, spin-on organic polymeric dielectrics (e.g., polytetrafluoroethylene, benzocyclobutene, polynorbornenes, polyimide), spin-on silicon based polymeric dielectrics (e.g., hydrogen silsesquioxane, methylsilsesquioxane), to provide some examples. In some such embodiments, the relatively thicker gate dielectric and/or relatively lower-k dielectric materials may be used to, for example, help reduce parasitic capacitance issues caused between the gate electrode and the S/D contacts (particularly where a thinned S/D region is employed). Numerous variations and configurations for gate dielectric 320 will be apparent in light of this disclosure.

Figure 3A:
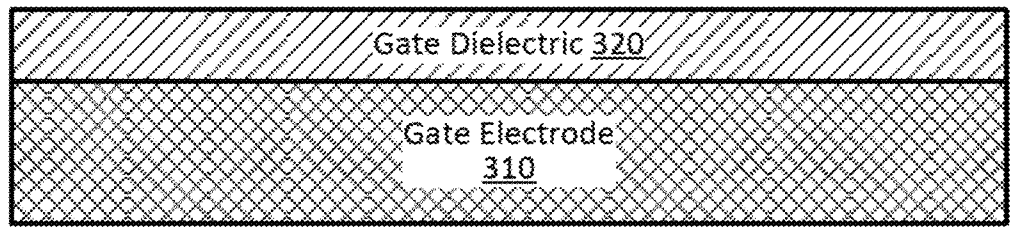
FIGS. 3A-3F illustrate cross-sectional views of example IC structures formed when carrying out the method of FIG. 2, in accordance with some embodiments.
Figure 3B:
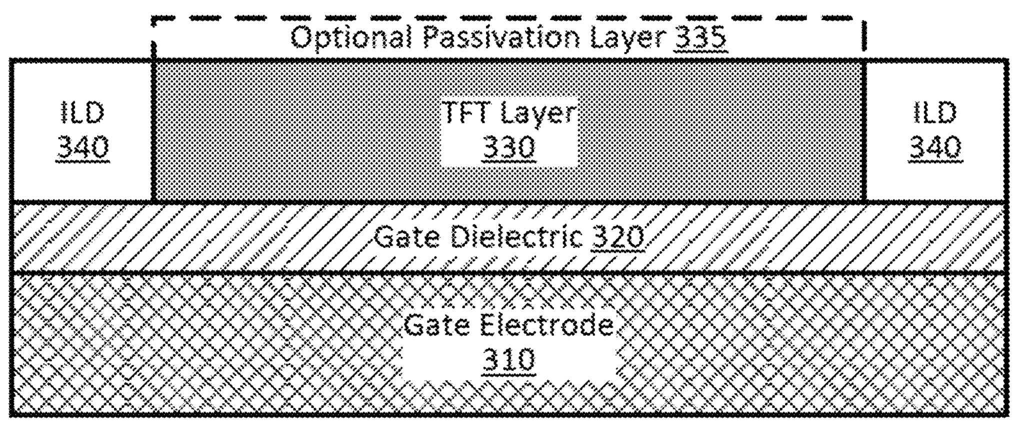
Figure 3B:
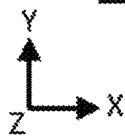

Method 200 of FIG. 2 continues with forming 208 thin-film transistor (TFT) layer 330 on the gate structure of FIG. 3A to form the example resulting structure of FIG. 3B, in accordance with some embodiments. More specifically, as shown in FIG. 3B, TFT layer 330 is formed directly on gate dielectric 320, in this example embodiment. In some embodiments, TFT layer 330 may be formed using any suitable processing, such as masking off areas where the TFT layer is not desired and depositing the TFT layer 330 material via any suitable technique (e.g., CVD, PVD, ALD, sputtering). In some embodiments, the TFT layer 330 material may be blanket deposited and then removed where it is not desired. As shown in FIG. 3B, interlayer dielectric (ILD) material 340 is also present on either side of TFT layer 330, in this example embodiment. Further note that, in some embodiments, optional passivation processing may be performed for the TFT layer 330, such as surface treatments of at least the exposed top surface of the TFT layer 330 and/or formation of at least one passivation layer 335. The optional at least one passivation layer 335 is shown only in FIG. 3B for ease of illustration, but it would be present in all subsequent structures where employed. Further, in embodiments where the at least one passivation layer 335 is employed, it may include any suitable dielectric material, such as any suitable oxide (such as silicon dioxide), high-k dielectric material (such as those previously described herein), and/or low-k dielectric material (such as those previously described herein).

TFT layer 330, in some embodiments, may include at least one metal oxide, such as indium gallium zinc oxide (referred to as IGZO), gallium oxide, indium oxide, indium tin oxide (referred to as ITO), indium zinc oxide (referred to as IZO), indium molybdenum oxide (referred to as IMO), copper oxide, zinc oxide, and/or zinc tin oxide (referred to as ZTO), to name a few examples. Thus, in some embodiments, TFT layer 330 may include one or more metals and also include oxygen. In some such embodiments, the one or more metals may include indium, gallium, zinc, tin, and/or molybdenum, to name some examples. In some embodiments, the metal oxide material (which in some cases may also be considered a semiconducting material, and more specifically, an oxide semiconductor material) may have a single crystal or monocrystalline (or simply, crystalline) structure (e.g., crystalline IGZO), an amorphous crystalline structure (e.g., amorphous IGZO), or a crystalline structure in between that may be referred to as a polycrystalline structure (e.g., polycrystalline IGZO). Further, in some such embodiments, the metal oxide material may have other type of crystalline structures, such as a C-axis aligned crystalline (CAAC) structure (e.g., CAAC IGZO) or a nanocrystalline structure (e.g., nanocrystalline IGZO). Note that these other type of crystalline structures may be well suited for production purposes because of their relatively low thermal budget requirements (that can be suitable with back-end-of line processing, such as thermal budgets of 400-600 degrees Celsius), relatively low cost, relatively high throughput, and relatively high reliability.

In some embodiments, the TFT layer 330 may include amorphous, polycrystalline, or monocrystalline group IV and/or group III-V semiconductor material, such as silicon, germanium, silicon germanium, gallium arsenide, or indium gallium arsenide, to name a few examples. For example, the TFT layer 330 may include hydrogenated amorphous silicon (a-Si:H) or polysilicon. In some embodiments, TFT layer 330 may include nitrogen, such as including zinc oxynitride (ZnON, such as a composite of zinc oxide (ZnO) and zinc nitride ($Zn_3N_2$), or of ZnO, $ZnO_xN_y$, and $Zn_3N_2$), to provide an example. In some embodiments, TFT layer 330 may be formed from a material of a first conductivity type, which may be an n-type or a p-type channel material. In some embodiments, an n-type channel material may include one or more of indium tin oxide (ITO), indium gallium zinc oxide (IGZO), indium zinc oxide (IZO), aluminum-doped zinc oxide (AZO), amorphous silicon, zinc oxide, amorphous germanium, polysilicon, poly germanium, and poly-III-V like indium arsenide. In some embodiments, a p-type channel material may include one or more of amorphous silicon (a-Si), zinc oxide (ZnO), amorphous germanium (a-Ge), polysilicon (polycrystalline silicon or poly-Si), poly-germanium (polycrystalline germanium or poly-Ge), poly-III-V material (e.g., poly-InAs), copper oxide, and tin oxide. In some embodiments, processing may be performed after depositing TFT layer 330 to affect the characteristics of TFT layer 330. For example, in some such embodiments, anneal processing may be performed to change the material of TFT layer 330 from an amorphous or polycrystalline structure to a monocrystalline structure. Numerous variations and configurations for the TFT layer 330 will be apparent in light of this disclosure.

ILD 340, in some embodiments, may be formed using any suitable techniques, such as depositing the ILD either prior to or after forming TFT layer 330, which may then be followed by planarization and/or polishing processing (e.g., chemical mechanical polishing/planarization (CMP) processing), for example. In some embodiments, ILD 340 may include any desired electrical insulator, dielectric, oxide or oxygen-containing material (e.g., silicon dioxide), nitride or nitrogen-containing material (e.g., silicon nitride), or a combination of both oxygen and nitrogen (e.g., silicon oxynitride), as will be apparent in light of this disclosure. In some embodiments, the ILD 340 may include carbon-doped silicon dioxide (or other carbon-doped oxides). Thus, in some embodiments ILD 340 may include carbon. In some embodiments, it may be desired to select material for ILD 340 that has a low dielectric constant and a high breakdown voltage. In some embodiments, to decrease dielectric constant, the ILD 340 may be formed to be intentionally porous, such as at least one porous carbon-doped oxide (e.g., porous carbon-doped silicon dioxide). Note that ILD 340 may include a multilayer structure, even though it is illustrated as a single layer. Also note that in some cases, ILD 340 and gate dielectric 320 may not include a distinct interface as shown in FIG. 3B, particularly where, e.g., the ILD 340 and gate dielectric 320 include the same dielectric material. Numerous variations and configurations for ILD 340 will be apparent in light of this disclosure.

Figure 3C:
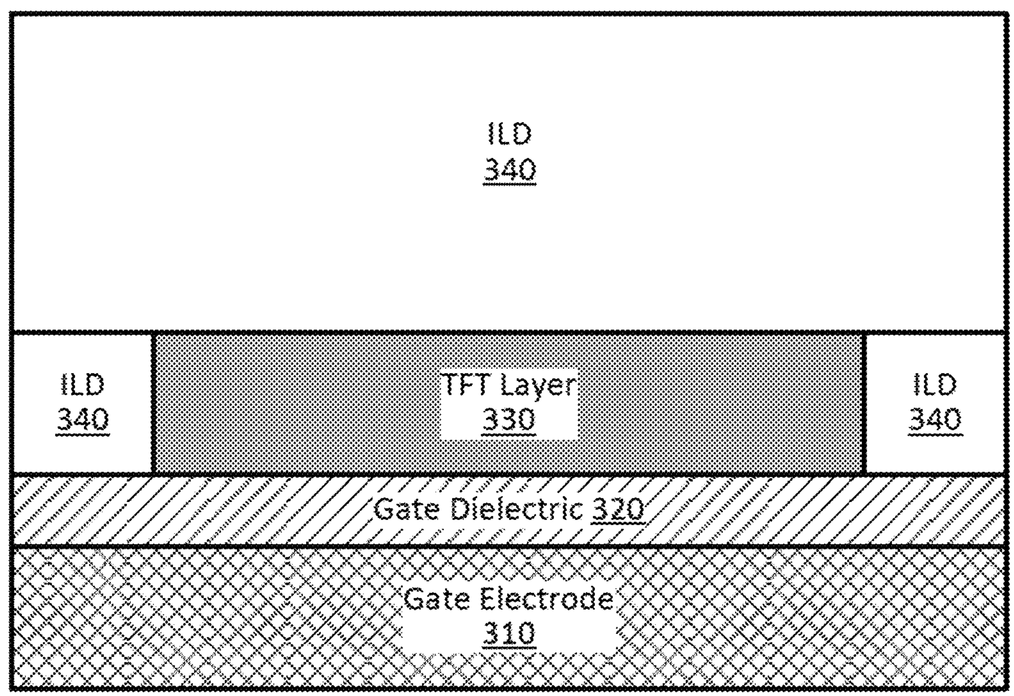

Method 200 of FIG. 2 continues with forming 210 ILD 340 on TFT layer 330 to form the example resulting structure of FIG. 3C, in accordance with some embodiments. The previous relevant description with respect to ILD layer 340 is equally applicable to this additional ILD 340 formed above TFT layer 330.

Figure 3D:
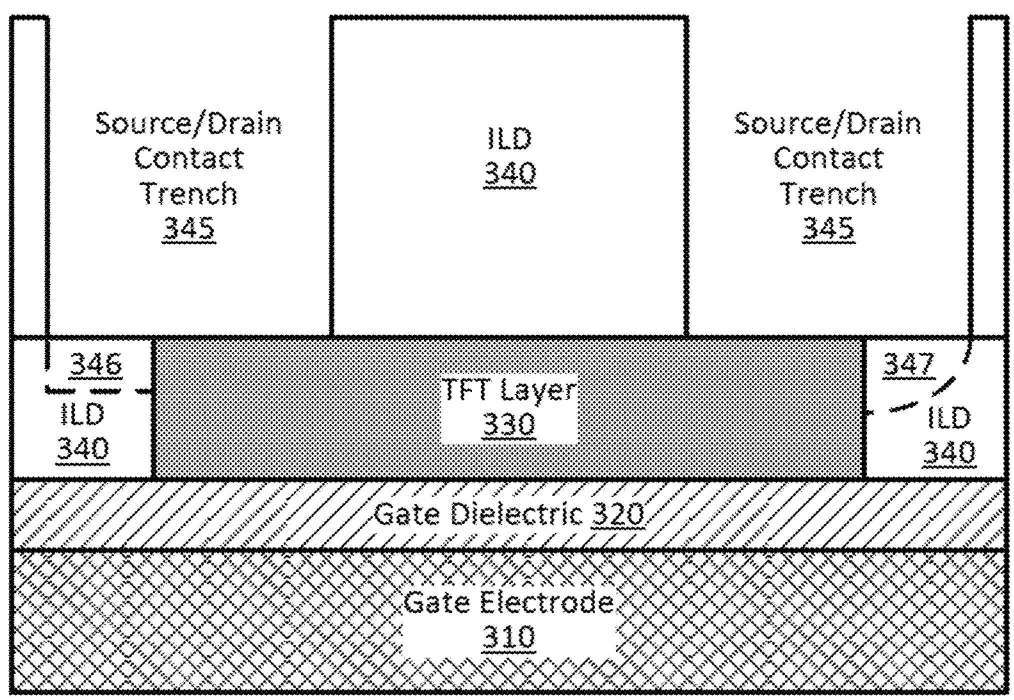
Figure 3E:
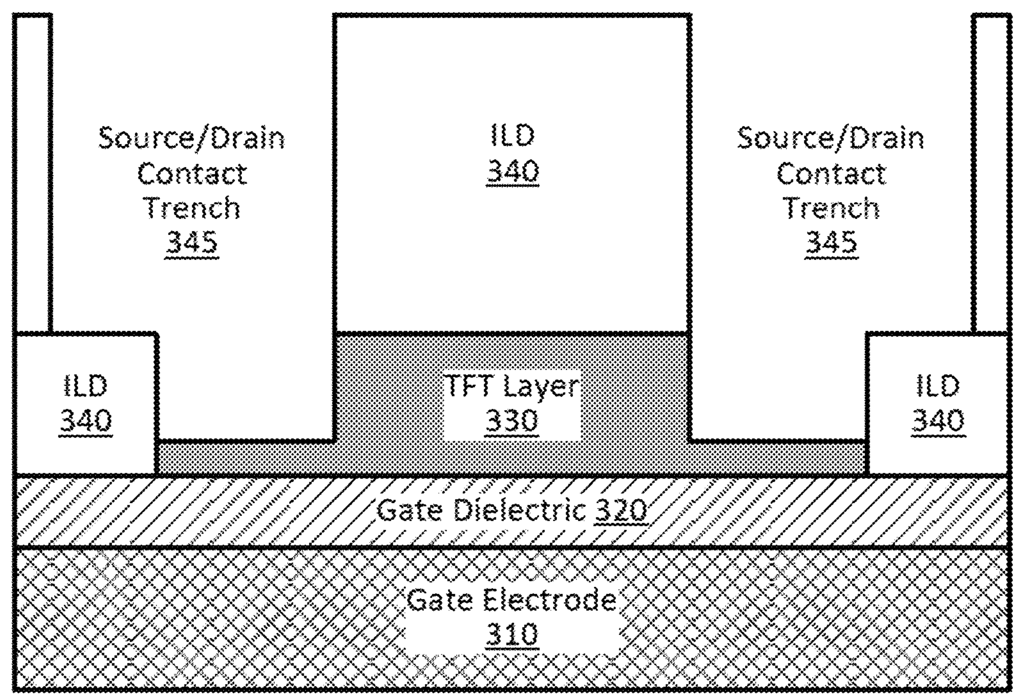

Method 200 of FIG. 2 continues with etching 212 ILD 340 above the S/D regions of TFT layer 330 to form S/D contact trenches 345 shown in the example resulting structure of FIG. 3D, in accordance with some embodiments. Such etch processing 212 may include any suitable wet and/or dry etch processes, which may or may not include hard masking areas that are not desired to be etched. In some embodiments, the etch processing 212 may only significantly remove dielectric material (e.g., include in ILD 340 and optional passivation layer 335, where present), such that the material of TFT layer 330 is not significantly removed when the etch processing 212 reaches that TFT layer 330. Thus, in some embodiments, the etch processing 212 (e.g., such as the etchant utilized) may be selective to the TFT layer 330 while effectively able to remove the material of ILD 340. Note that although S/D contact trenches 345 are shown as having stopped the removal of ILD material 340 at the top surface of TFT layer 330, in some embodiments, etch processing 212 may remove additional ILD material on one or both sides of TFT layer 330. For instance, etch processing 212 may remove a portion of that adjacent ILD material 340, such as a somewhat rectangular portion 346 or a curved portion 347, for example. In some embodiments, etch processing 212 may be controlled such that the ILD adjacent to TFT layer 330 is only removed as desired (e.g., not significantly removed, so that the resulting S/D contact structure is sufficiently distanced from the underlying gate structure).

Method 200 of FIG. 2 continues with etching 214 TFT layer 330 to thin one or both of the S/D regions, in accordance with some embodiments. In the example resulting structure of FIG. 3E, both S/D regions were thinned, where the S/D regions were defined by the openings of the S/D contact trenches 345, as can be understood based on this disclosure. Such etch processing 214 may include any suitable wet and/or dry etch processes, which may or may not include hard masking areas that are not desired to be etched. In some embodiments, the etch processing 214 may include a timing component to intentionally remove a desired portion of the TFT layer 330 in the S/D regions. The resulting thicknesses caused by etch processing 214 will be described in more detail herein.

Method 200 of FIG. 2 continues with performing 216 S/D region processing as desired to make the S/D regions suitable for the end TFT device, in accordance with some embodiments. In some embodiments, the S/D region processing 216 may include doping the S/D regions to form oxygen vacancies and/or to introduce impurities (e.g., n-type and/or p-type impurities) to achieve desired resulting S/D regions for the TFT device being formed. In some embodiments, such processing may be performed through S/D contact trenches 345. For instance, in some such embodiments, oxygen vacancies may be formed on the surface of the exposed TFT layer 330 material (e.g., the surface of TFT layer 330 exposed by S/D contact trench 345), such as via plasma treatment to damage the exposed surfaces, chemical treatment to extract material from the TFT layer 330 (e.g., extract indium, gallium, and/or zinc from IGZO) to form a modified surface that has higher oxygen vacancies, anidation type of treatment (e.g., silicidation or III-V-idation type of reaction) to strip the S/D surfaces of oxygen and leave vacancies, and/or any other suitable processing as can be understood based on this disclosure. In some embodiments, the processing may include removing the material of the initial TFT layer 330 in the S/D regions and reforming the final S/D material.

Figure 3F:
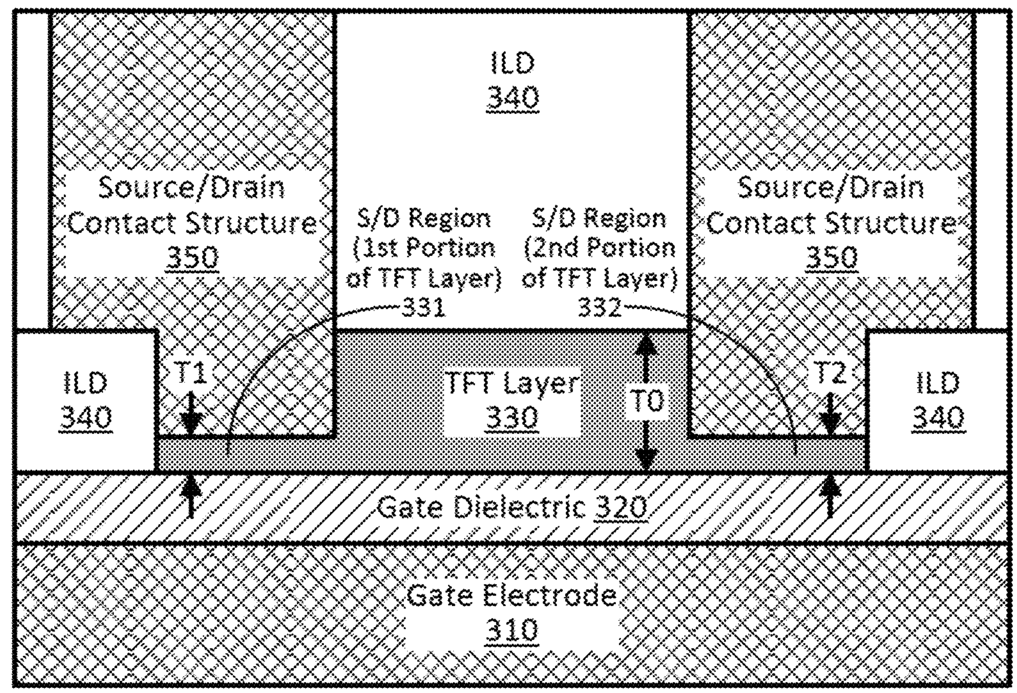

Method 200 of FIG. 2 continues with forming 218 S/D contact structures 350 in S/D contact trenches 345 thereby forming the example resulting structure of FIG. 3F, in accordance with some embodiments. In some embodiments, S/D contact structures 350 may be formed 218 using any suitable techniques, such as depositing the material if S/D contact structures 350 in the S/D contact trenches 345 via any suitable technique (e.g., CVD, PVD, ALD, sputtering). In some embodiments, S/D contact structures 350 may include one or more metals and/or other suitable electrically conductive material. In some embodiments, forming 218 S/D contact structures 350 may include silicidation, germanidation, III-V-idation, and/or annealing processes, for example. In some embodiments, one or both of the S/D contact structures 350 may include a resistance reducing metal and a contact plug metal, or just a contact plug, for instance. Example contact resistance reducing metals include, for instance, nickel, titanium, titanium nitride, tantalum, tantalum nitride, cobalt, gold, gold-germanium, nickel-platinum, nickel aluminum, and/or other such resistance reducing metals or alloys. Example contact plug metals include, for instance, aluminum, tungsten, ruthenium, or cobalt, although any suitable conductive metal or alloy can be used. In some embodiments, additional layers may be present in the S/D contact structures 350, such as adhesion layers (e.g., titanium nitride) and/or liner or barrier layers (e.g., tantalum nitride), if so desired. In some embodiments, a contact resistance reducing layer may be present between a given S/D region 331/332 and its corresponding S/D contact structures 350. Numerous variations and configurations for the S/D contact structures 350 will be apparent in light of this disclosure.

As shown in the structure of FIG. 3F, S/D regions 331 and 332 (which include a first portion of TFT layer 330 and a second portion of TFT layer 330, respectively) have thicknesses (dimension in the Y-axis direction) of T1 and T2, respectively. Further, TFT layer 330 in the channel region or the region between S/D regions 331 and 332 has a thickness (dimension in the Y-axis direction) of T0, which may be the original thickness of TFT layer 330, for example. In some embodiments, the channel region of TFT layer 330 (between S/D regions 331 and 332) may have a thickness T0 in the range of, or a specific value in the range of, 10-100 nm (or in a sub-range of 10-25, 10-50, 10-75, 25-50, 25-75, 25-100, or 50-100 nm), or within any other suitable range as can be understood based on this disclosure. In some such embodiments, T0 may have a thickness in the sub-range of 25-65 nm. In some embodiments, T0 may be expressed based on a threshold value, such as being at least 10, 15, 20, 25, 30, 40, 50, 60, 70, or 80 nm, and/or T0 may be at most 100, 80, 60, 50, 40, 30, 25, 20, or 15 nm, for example. In some embodiments, the techniques described herein may be used to thin the TFT layer 330 (e.g., from T0) by a thickness in the range of 5-80 nm (or in a sub-range of 5-10, 5-15, 5-20, 5-25, 5-50, 10-25, 10-50, 10-80, 20-40, 20-60, 20-80, 25-50, 25-80, or 50-80 nm), for example. In some embodiments, the techniques descried herein may be used to thin the TFT layer 330 (e.g., from T0) by a thickness of at least 5, 10, 15, 20, 25, 30, 40, 50, or 60 nm, and/or by a thickness of at most 80, 60, 40, 30, 20, or 10 nm, for example. In some embodiments, the techniques described herein may be used to thin the TFT layer 330 (e.g., from T0) by 25-90%, for example. To provide an illustrative example, starting with an initial TFT layer 330 thickness T0 of 20 nm, the S/D region may be thinned down 75% to 5 nm (e.g., such that T1 and T2 are 5 nm).

In some embodiments, T1 and T2 may be in the range of, or a specific value in the range of, 2-20 nm (or in a sub-range of 2-5, 2-10, 2-15, 3-5, 3-10, 5-8, 5-10, 5-15, 5-20, 10-15, or 10-20 nm), or within any other suitable range as can be understood based on this disclosure. In some embodiments, T1 and T2 may be expressed based on a threshold value, such as being at least 2, 3, 4, 5, 8, 10, or 15 nm, and/or at most 20, 15, 10, 8, 5, or 3 nm, for example. In some embodiments, it may be desired to thin a given S/D region to sub-10 nm or sub-5 nm, and/or to achieve a thickness of 3-5 nm to induce more electrostatic charge in that S/D region. In other words, in some such embodiments, it may be desired to have T1 and T2 be sub-10 nm or sub-5 nm, and/or in the range of 3-5 nm. In some embodiments, the width (dimension in the X-axis direction) of the channel region (e.g., the region between S/D regions 331 and 332) is in the range of 10-200 nm (e.g., 20-100 nm, but in some embodiments, desired to be 10-50 nm), or within any other suitable range as can be understood based on this disclosure.

Note that in some embodiments, the S/D regions of the TFT layer may also reside along the sidewall of S/D contact structures 350, such as where those sidewalls are sufficiently doped (e.g., with oxygen vacancies), to provide an example. Thus, in some cases, the portions between the S/D contact structures 350 and the gate structure (e.g., including gate dielectric 320 and gate electrode 310) may be described as such and referred to as first and second portions of the TFT layer 330. As can be understood based on this disclosure, in some embodiments, those first and second portions of the TFT layer 330 are the portions of that layer that are only or primarily thinned using the techniques described herein. Also note that the thinning described herein may, in some embodiments, increase the effective surface area between an S/D contact structure 350 and the corresponding S/D region, as compared to no thinning at all. For instance, the effective surface area may increase by 5-75%, depending on the configuration and S/D doping scheme employed. Numerous variations and configurations on the S/D regions will be apparent in light of this disclosure.

Method 200 of FIG. 2 continues with completing 220 integrated circuit (IC) processing as desired, in accordance with some embodiments. Such additional processing to complete the IC may include back-end-of-line (BEOL) processing (or additional BEOL processing) to form one or more metallization layers and/or to interconnect the devices formed on the IC, for example. For instance, in some embodiments, the back-gated TFT device with at least one thinned S/D region described herein may be a part of another device, such as part of a memory device. For example, the memory device (or embedded memory device) may include: random-access memory (RAM), such as dynamic RAM (DRAM), static RAM (SRAM), and/or resistive RAM (RRAM or ReRAM); read-only memory (ROM); and/or other various volatile or nonvolatile memory. However, the TFT devices described herein may be used in any other IC or semiconductor device or circuit, as can be understood based on this disclosure. Note that the processes 202-220 in method 200 of FIG. 2 are shown in a particular order for ease of description. However, one or more of the processes may be performed in a different order or may not be performed at all (and thus be optional), in accordance with some embodiments. Further, in some embodiments, additional processes may be performed, as can be understood based on this disclosure. Numerous variations on the methodology and the techniques described herein will be apparent in light of this disclosure.

Figure 4:
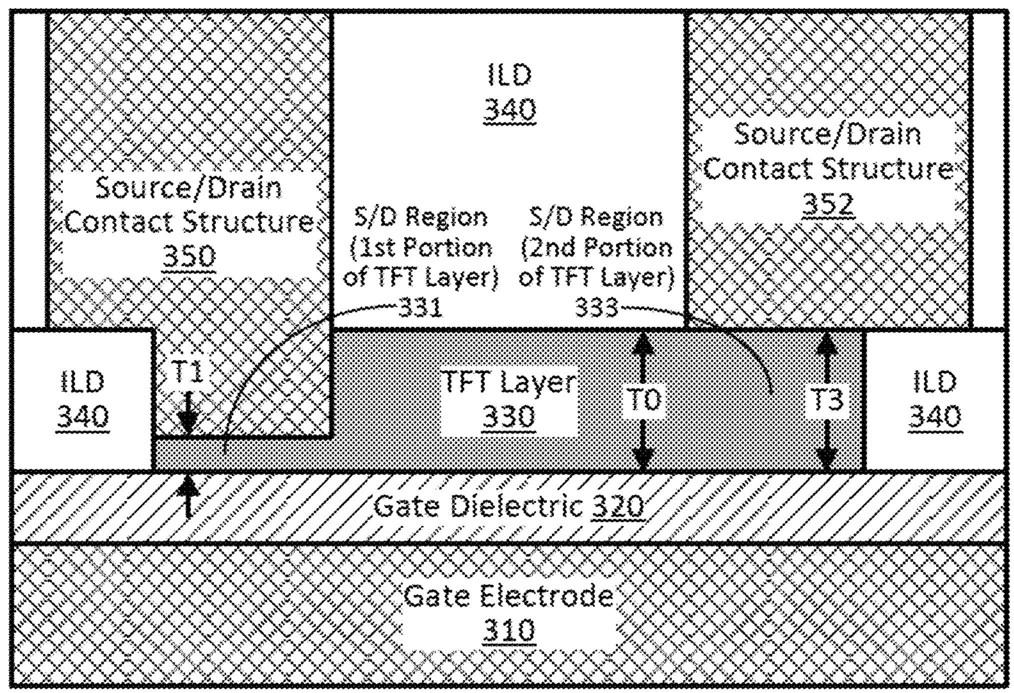
FIG. 4 illustrates the cross-sectional view of the example IC structure of FIG. 3F, with only one S/D region having been thinned, in accordance with some embodiments.

FIG. 4 illustrates the cross-sectional view of the example IC structure of FIG. 3F, with only one S/D region having been thinned, in accordance with some embodiments. Thus, the previous relevant description with respect to the IC structures and TFT devices disclosed herein (and all related features) is equally applicable to the structure of FIG. 4. As shown in FIG. 4, the TFT layer 330 was only thinned on one side, that is, the left side, which is the same as thinned S/D region 331 from FIG. 3F. However, the other S/D region 333, which is the second portion of TFT layer 330 between S/D contact structure 352 and the gate structure (including gate dielectric 320 and gate electrode 310), has not been thinned at all, in this example structure, such that its thickness T3 (dimension in the Y-axis direction) is the same as the thickness T0 of the channel region of TFT layer 330. Thus, in some embodiments, the drain region may be intentionally thinned while the source region is not, or the source region may be intentionally thinned while the drain region is not. In other embodiments, both of the S/D regions may be intentionally thinned, but at different amounts. In some such embodiments, the S/D regions may be processed separately and/or one may be masked off at a point in the processing to allow for the distinct thinning amounts. For instance, in some such embodiments, using the structure of FIG. 4, if the second S/D region 333 were thinned some, but less than the amount of thinning that led to T1, then T1 may be 3-20 nm (e.g., 5-10 nm) thinner than T3, for example. Thus, in such an embodiment, T0 would be greater than T3, and both T0 and T3 would be greater than T1. To provide an illustrative example, T0 may be 30 nm, T3 may be thinned down to 20 nm, and T1 may be thinned down to 5 nm, in accordance with an embodiment. For example, in some embodiments, it may be desired to thin the source region more than the drain region, or it may be desired to thin the drain region more than the source region. Numerous variations and configurations for S/D thinning schemes will be apparent in light of this disclosure.

Figure 5:
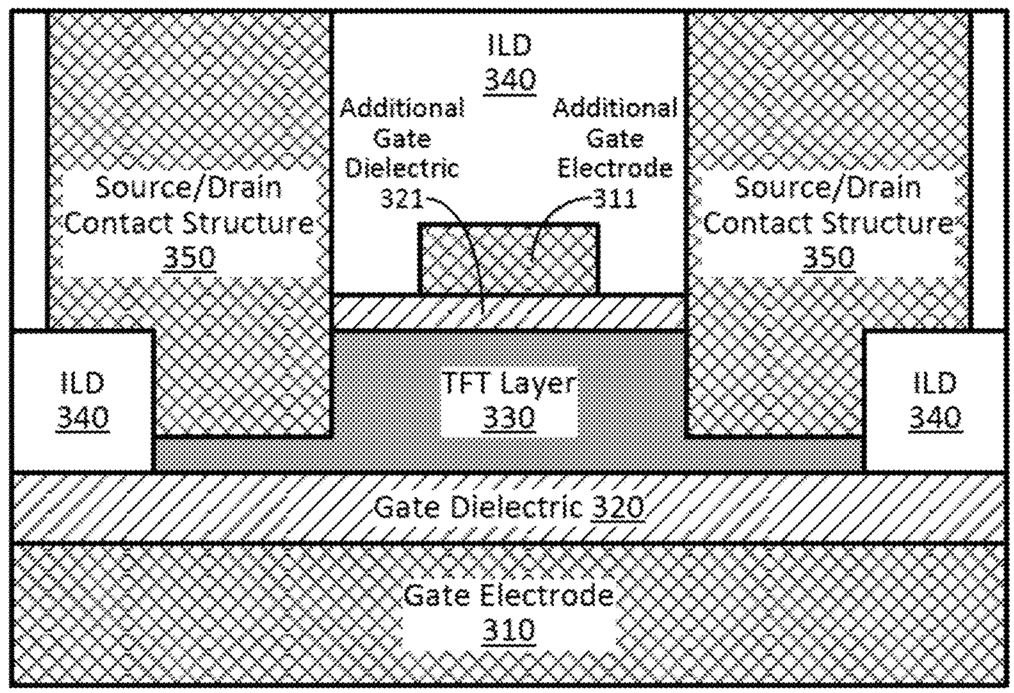
FIG. 5 illustrates the cross-sectional view of the example IC structure of FIG. 3F, with an additional gate structure, in accordance with some embodiments.

FIG. 5 illustrates the cross-sectional view of the example IC structure of FIG. 3F, with an additional gate structure, in accordance with some embodiments. Thus, the previous relevant description with respect to the IC structures and TFT devices disclosed herein (and all related features) is equally applicable to the structure of FIG. 5. As shown, in this example embodiment, the additional gate structure includes additional gate dielectric 321 and additional gate electrode 311. Further, as shown in FIG. 5, the additional gate structure was formed on top of the channel region of TFT layer 330, and thus, the additional gate structure may be considered a front-gated or top-gated structure, for example. In addition, because the TFT device of FIG. 5 includes two separate gates, it may be considered a dual-gate structure, for example. The previous relevant description with respect to gate electrode 310 and gate dielectric 320 is equally applicable to gate electrode 311 and gate dielectric 321, respectively, such as the material and thickness description, with the exception that gate electrode 311 and gate dielectric 321 are between S/D contact structures 350, as shown In FIG. 5. Numerous variations and configurations for dual-gate TFT devices with at least one thinned S/D region will be apparent in light of this disclosure.

Figure 6:
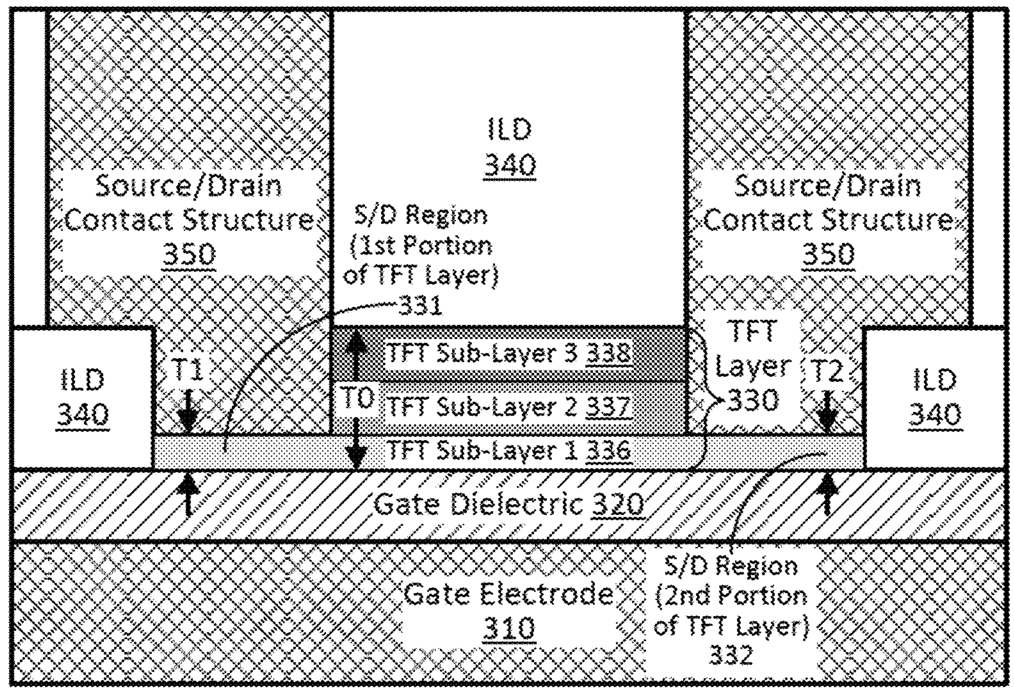
FIG. 6 illustrates the cross-sectional view of the example IC structure of FIG. 3F, with a multilayer TFT layer, in accordance with some embodiments.

FIG. 6 illustrates the cross-sectional view of the example IC structure of FIG. 3F, with a multilayer TFT layer, in accordance with some embodiments. Thus, the previous relevant description with respect to the IC structures and TFT devices disclosed herein (and all related features) is equally applicable to the structure of FIG. 6. As shown in FIG. 6, TFT layer 330 has a multilayer structure including three sub-layers, a first TFT sub-layer 336, a second TFT sub-layer 337, and a third TFT sub-layer 338, in this example embodiment. Note that although multilayer TFT layer includes three sub-layers in the example embodiment of FIG. 6, in general, such a multilayer TFT layer may include two or more sub-layers, in some embodiments. Further, in some such embodiments, at least two of the sub-layers may include compositionally different material. For instance, the first and third TFT sub-layers 336 and 338 may include the same material, but be compositionally distinct from the second TFT sub-layer 337. Alternatively, each of the three sub-layers may include material that is compositionally distinct from the other two. The previous relevant description with respect to TFT layer 330 is equally applicable to TFT sub-layers 336, 337, and 338, such as the material and thickness description, with the exception that the TFT sub-layers are a part of a multilayer TFT layer, as shown in FIG. 6.

In embodiments including a multilayer TFT layer (such as that shown in FIG. 6), if the different material compositions of the TFT sub-layers allow for selective etching, selective etch processing may be utilized to remove one or more of the upper-most sub-layers (or those first exposed via the S/D contact trench) while the one or more remaining bottom-most sub-layers act as an etch stop (or at least an etch slow down mechanism) to control the thinning process. Note that in some such cases, perfect or even high etch selectivity need not be required between the one or more upper-most sub-layers to be removed and the remaining bottom-most sub-layers desired to be maintained, as even low relative etch selectivity may provide enhanced control for thinning the TFT layer in the S/D regions, as can be understood based on this disclosure. For example, the second and third TFT sub-layers 337 and 338 may have been removed In the S/D regions through S/D contact trenches 345 using a given etchant that is selective to the first TFT sub-layer 336, where such selectivity means that the given etchant does not significantly remove, or removes at a slower rate, the material of the first TFT sub-layer 336 relative to how the given etchant removes at least the second TFT sub-layer 337. In such embodiments, the first TFT sub-layer 336 can be used as an etch-stop, for example, to ensure that first TFT sub-layer 336 is preserved, at least in part, in the S/D regions. Note that TFT sub-layers 336, 337, and 338 in FIG. 6 are shaded differently to assist with visual identification of the different sub-layers, but such shading is not intended to limit the multilayer TFT layer in any manner. Numerous variations and configurations for multilayer TFT devices will be apparent in light of this disclosure.

Figure 7:
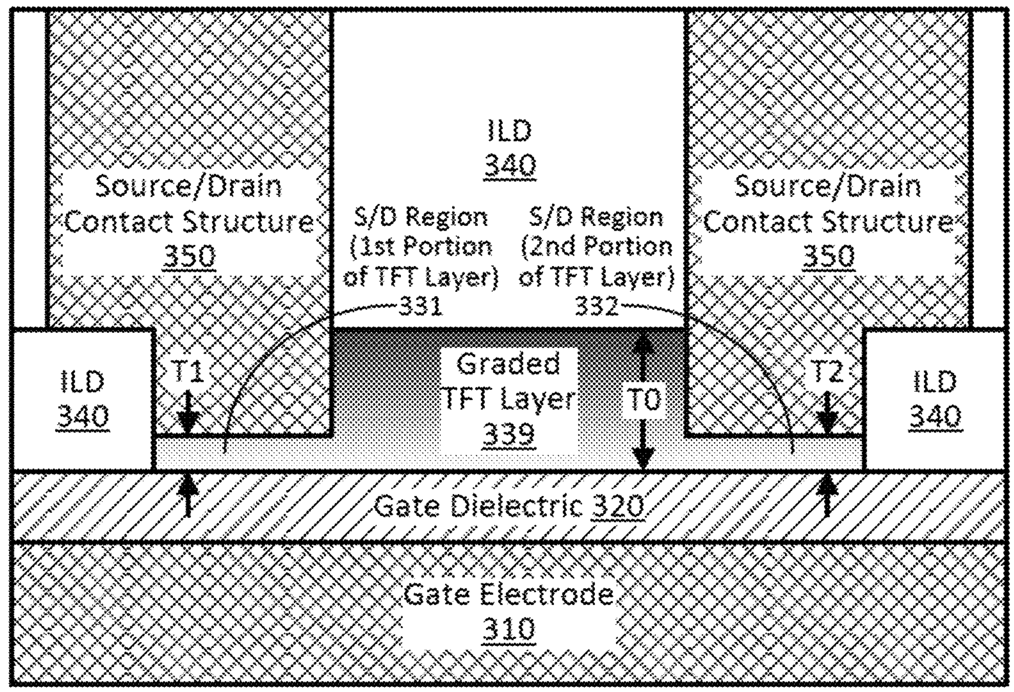
FIG. 7 illustrates the cross-sectional view of the example IC structure of FIG. 3F, with a graded TFT layer, in accordance with some embodiments.

FIG. 7 illustrates the cross-sectional view of the example IC structure of FIG. 3F, with a graded TFT layer, in accordance with some embodiments. Thus, the previous relevant description with respect to the IC structures and TFT devices disclosed herein (and all related features) is equally applicable to the structure of FIG. 7. As shown in FIG. 7, the TFT layer 330 is a graded TFT layer 339, where the concentration of one or more materials within the TFT layer 339 is graded (e.g., increased and/or decreased), as desired. For example, in some such embodiments, the composition of a first material included in the graded TFT layer 339 may be increased going up the thickness of the graded TFT layer 339, while the composition of a second material included in the graded TFT layer 339 may be decreased in the same direction. To provide a more specific example, if the graded TFT layer 339 includes graded IGZO, the bottom of the graded TFT layer 339 (nearest the gate structure) may include a relatively high indium concentration which is decreased along the thickness of the graded TFT layer 339 (e.g., decreases in the positive Y direction), such that the top of the graded TFT layer 339 includes a relatively lower indium concentration. Further, in such a specific example, the gallium and/or zinc concentration included in the graded TFT layer 339 may increase moving along the thickness of the TFT layer (e.g., increase in the positive Y direction), such that the gallium and/or zinc concentration is relatively lowest near the gate structure and relatively highest farthest from the gate structure (e.g., near the overlying ILD 340). Note that graded TFT layer 339 in FIG. 7 is shaded to indicate it is a graded layer, but such shading is not intended to limit the graded TFT layer 339 in any manner. Numerous variations and configurations for graded TFT devices will be apparent in light of this disclosure.

FIG. 8 illustrates a cross-sectional view of an example IC structure including a back-gated TFT device including thinned S/D regions at a back-end-of-line (BEOL) IC location, in accordance with some embodiments of the present disclosure. The previous relevant description with respect to the IC structures and TFT devices disclosed herein (and all related features) is equally applicable to the structure of FIG. 8. As shown in FIG. 8, the front-end-of-line (FEOL) portion 300 of the IC includes substrate 301, insulator layer 302, and device layer 303, in this example embodiment, as the substrate includes a semiconductor on insulator (or XOI) configuration, where the insulator layer may include one or more oxides (e.g., silicon dioxide) and/or other dielectric materials (e.g., silicon nitride). In other embodiments, insulator layer 302 may not be present, such as for a bulk silicon wafer or for an insulator substrate (e.g., a glass substrate). Device layer 303, may include any desired IC devices, such as various transistors (e.g., metal-oxide-semiconductor field-effect transistors or MOSFETs, which may be used for logic or RF applications), various capacitors, various resistors, and so forth. Note that although device layer 303 is labelled as such, IC devices may also be formed elsewhere, such as the TFT device, including TFT layer 330, that is formed at the BEOL portion 305 of the IC structure. As shown in FIG. 8, the BEOL portion also shows four metallization levels, where the ILD is numbered 341, 342, 343, and 344, with included interconnect features (e.g., vias and/or metallization lines) 361, 362, 363, and 364, respectively. The previous relevant description with respect to ILD 340 is equally applicable to ILD 341-344. In some embodiments, interconnects 361-364 may include metal and/or metal alloy material (e.g., copper, tungsten, titanium nitride, tantalum nitride).

In the example structure of FIG. 8, the TFT device is formed between and inclusive of the metal line of metallization layer 2 and the metal line of metallization layer 3. For instance, in the example structure of FIG. 8, the gate structure, including gate electrode 310 and gate dielectric 320 are formed at the metal line (the upper portion) of metallization layer 2, within ILD 342, the TFT layer 330 is formed in the lower portion of metallization layer 3, within ILD 343, and the S/D contact structure 350 are formed within the metal line (the upper portion) of metallization layer 3, within ILD 343, and extending down into the lower portion of metallization layer 3, as shown. Further, gate electrode 310 may be accessed/interconnected off the left side of the structure shown (e.g., in the negative X-axis direction) or at a different cross-sectional depth (e.g., in the positive or negative Z-axis direction) than the cross-sectional view shown in FIG. 8. Generally, as can be understood based on this disclosure, when the TFT device with at least one thinned S/D region variously described herein is formed at a BEOL IC location, it may be formed at any metallization line(s). In addition, in some embodiments, the TFT device with at least one thinned S/D region variously described herein may be formed at an FEOL IC location, such as in device layer 303 (which is on insulator layer 302), for example. Numerous variations and configurations will be apparent in light of this disclosure.

Example System

Figure 9:
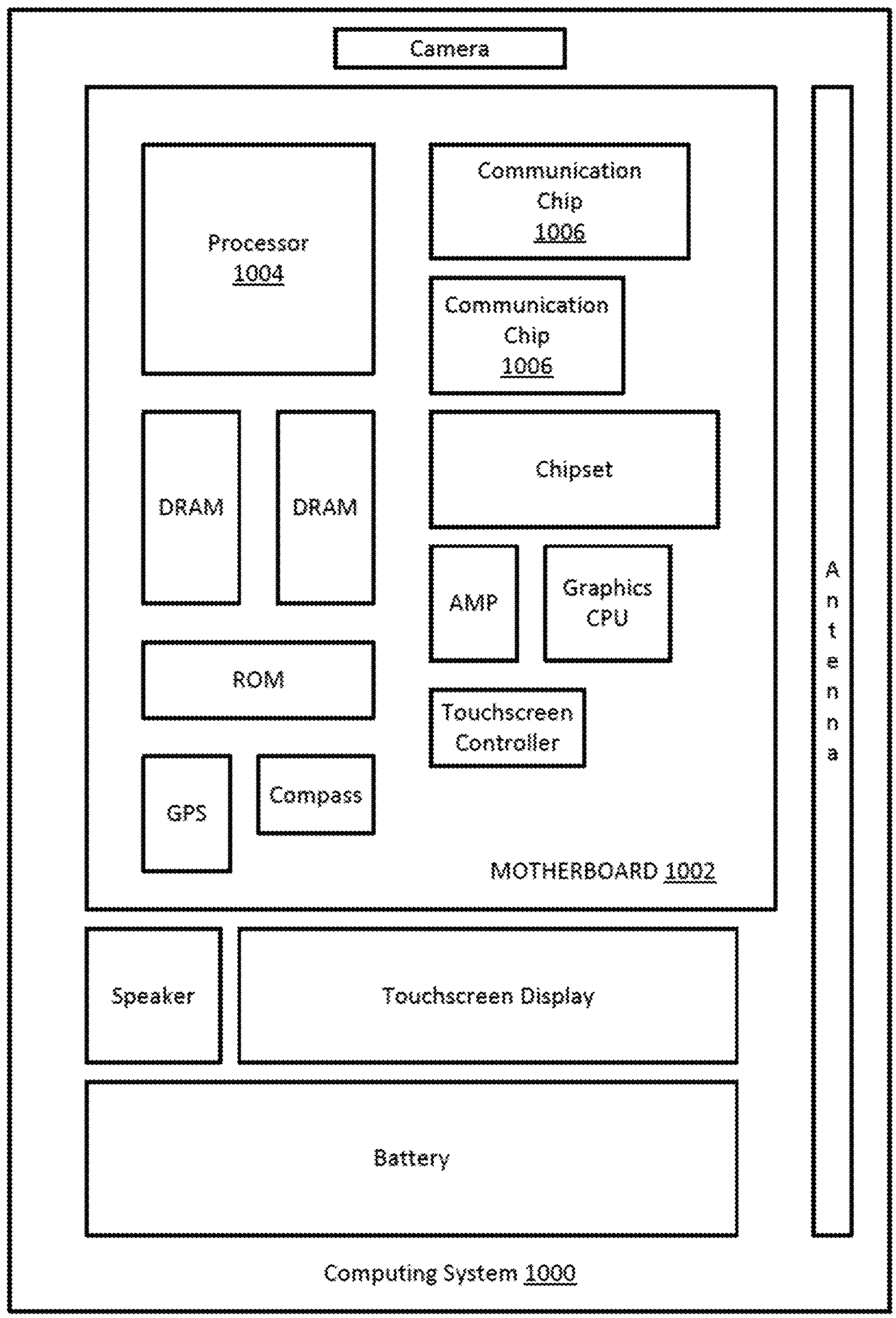
FIG. 9 illustrates a computing system implemented with IC structures and/or transistor devices formed using the techniques disclosed herein, in accordance with some embodiments of the present disclosure.

FIG. 9 illustrates a computing system 1000 implemented with integrated circuit structures and/or transistor devices formed using the techniques disclosed herein, in accordance with some embodiments of the present disclosure. For example, the TFT devices including at least one thinned S/D region may be included in one or more portions of computing system 1000. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc.

Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices formed using the disclosed techniques in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices formed using the disclosed techniques as variously described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing system 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device or system that processes data or employs one or more integrated circuit structures or devices formed using the disclosed techniques, as variously described herein. Note that reference to a computing system is intended to include computing devices, apparatuses, and other structures configured for computing or processing information.

Further Example Embodiments

The following examples pertain to further embodiments, from which numerous permutations and configurations will be apparent.

Example 1 is a transistor including: a gate electrode including one or more metals; a gate dielectric on the gate electrode; a layer on the gate dielectric, the layer including one or more metals, the layer also including oxygen; a first contact structure on the layer, the first contact structure including one or more metals, a first portion of the layer between the first contact structure and the gate dielectric; and a second contact structure on the layer, the second contact structure including one or more metals, a second portion of the layer between the second contact structure and the gate dielectric; wherein the first portion of the layer has a first thickness, the second portion of the layer has a second thickness, and a third portion of the layer between the first and second portions of the layer has a third thickness, the third thickness at least 10 nanometers (nm) greater than one or both of the first thickness or the second thickness.

Example 2 includes the subject matter of Example 1, wherein the one or more metals included in the layer includes at least one of indium, gallium, or zinc.

Example 3 includes the subject matter of Example 1 or 2, wherein the one or more metals included in the layer includes indium, gallium, and zinc.

Example 4 includes the subject matter of any of Examples 1-3, wherein the gate dielectric includes one or more high-k dielectric materials.

Example 5 includes the subject matter of any of Examples 1-4, wherein the gate dielectric includes hafnium and oxygen.

Example 6 includes the subject matter of any of Examples 1-3, wherein the gate dielectric includes one or both of silicon dioxide or low-k dielectric material.

Example 7 includes the subject matter of any of Examples 1-6, wherein the gate dielectric includes a thickness between the gate electrode and the layer of at least 5 nm.

Example 8 includes the subject matter of any of Examples 1-7, wherein one or both of the first thickness or the second thickness is at most 10 nm.

Example 9 includes the subject matter of any of Examples 1-8, wherein one or both of the first thickness or the second thickness is at most 5 nm.

Example 10 includes the subject matter of any of Examples 1-9, wherein the third thickness is at least 10 nm greater than both the first thickness and the second thickness.

Example 11 includes the subject matter of any of Examples 1-10, further including an additional gate dielectric on a side of the layer opposite the gate dielectric, and an additional gate electrode on the additional gate dielectric, the additional gate electrode including one or more metals.

Example 12 includes the subject matter of any of Examples 1-11, wherein the one or more metals and the oxygen included in the layer are included throughout the entirety of the layer.

Example 13 includes the subject matter of any of Examples 1-12, wherein the layer is a multilayer structure including at least two compositionally different sub-layers, individual sub-layers including one or more metals, individual sub-layers also including oxygen.

Example 14 includes the subject matter of Example 13, wherein the third portion of the layer includes at least one sub-layer that is absent in the first and second portions of the layer.

Example 15 includes the subject matter of any of Examples 1-14, wherein at least one material included in the third portion of the layer increases in content along the third thickness.

Example 16 includes the subject matter of any of Examples 1-15, wherein one or both of the first contact structure or the second contact structure extends past an end of the layer.

Example 17 includes the subject matter of any of Examples 1-16, wherein total surface area between the first contact structure and the layer is increased by at least 25 percent based on the third thickness being at least 10 nm greater than the first thickness, and wherein total surface area between the second contact structure and the layer is increased by at least 25 percent based on the third thickness being at least 10 nm greater than the second thickness.

Example 18 includes the subject matter of any of Examples 1-17, wherein the first contact structure and the second contact structure are above the gate electrode.

Example 19 is an embedded memory device including the subject matter of any of Examples 1-18.

Example 20 is an integrated circuit including the subject matter of any of Examples 1-19, wherein the transistor is at a back-end-of-line location of the integrated circuit.

Example 21 is a computing system including the subject matter of any of Examples 1-20.

Example 22 is an integrated circuit including at least one transistor, the integrated circuit including: a gate electrode including one or more metals; a layer including one or more metals, the layer also including oxygen; a gate dielectric between the gate electrode and the layer; a first contact structure on the layer, the first contact structure including one or more metals, a first portion of the layer between the first contact structure and the gate dielectric; and a second contact structure on the layer, the second contact structure including one or more metals, a second portion of the layer between the second contact structure and the gate dielectric; wherein the first portion of the layer has a first thickness of at most 10 nanometers (nm), the second portion of the layer has a second thickness of at most 10 nm, and a third portion of the layer between the first and second portions of the layer has a third thickness, the third thickness greater than the first thickness and the second thickness.

Example 23 includes the subject matter of Example 22, wherein the one or more metals included in the layer includes at least one of indium, gallium, or zinc.

Example 24 includes the subject matter of Example 22 or 23, wherein the one or more metals included in the layer includes indium, gallium, and zinc.

Example 25 includes the subject matter of any of Examples 22-24, wherein the gate dielectric includes one or more high-k dielectric materials.

Example 26 includes the subject matter of any of Examples 22-25, wherein the gate dielectric includes hafnium and oxygen.

Example 27 includes the subject matter of any of Examples 22-26, wherein the third thickness is at least 10 nm greater than one or both of the first thickness or the second thickness.

Example 28 includes the subject matter of any of Examples 22-27, wherein the first thickness and the second thickness are at most 5 nm.

Example 29 includes the subject matter of any of Examples 22-28, wherein the third thickness is at least 15 nm.

Example 30 includes the subject matter of any of Examples 22-29, further including; an additional gate dielectric on a side of the layer opposite the gate dielectric; and an additional gate electrode on the additional gate dielectric, the additional gate electrode including one or more metals.

Example 31 includes the subject matter of any of Examples 22-30, wherein the one or more metals and the oxygen included in the layer are included throughout the entirety of the layer.

Example 32 includes the subject matter of any of Examples 22-31, wherein the layer is a multilayer structure including at least two compositionally different sub-layers, individual sub-layers including one or more metals, individual sub-layers also including oxygen.

Example 33 includes the subject matter of Example 32, wherein the third portion of the layer includes at least one sub-layer that is absent in the first and second portions of the layer.

Example 34 includes the subject matter of any of Examples 22-33, wherein at least one material included in the third portion of the layer increases in content along the third thickness.

Example 35 includes the subject matter of any of Examples 22-34, wherein one or both of the first contact structure or the second contact structure extends past an end of the layer.

Example 36 includes the subject matter of any of Examples 22-35, wherein total surface area between the first contact structure and the layer is increased by at least 25 percent based on the third thickness being at least 10 nm greater than the first thickness, and wherein total surface area between the second contact structure and the layer is increased by at least 25 percent based on the third thickness being at least 10 nm greater than the second thickness.

Example 37 includes the subject matter of any of Examples 22-36, wherein the first contact structure and the second contact structure are above the gate electrode.

Example 38 includes the subject matter of any of Examples 22-37, wherein the gate electrode is at a back-end-of-line location of the integrated circuit.

Example 39 includes the subject matter of any of Examples 22-38, further including a substrate, wherein at least one metallization line is between the substrate and the gate electrode.

Example 40 includes the subject matter of any of Examples 22-37, further including a substrate including silicon, and an additional layer including insulating material on the substrate, wherein the gate electrode is on the additional layer.

Example 41 is a mobile computing system including the subject matter of any of Examples 22-40.

Example 42 is a method of forming a transistor, the method including: forming a gate electrode including one or more metals; forming a gate dielectric on the gate electrode; forming a layer on the gate dielectric, the layer including one or more metals, the layer also including oxygen; forming a first contact structure on the layer, the first contact structure including one or more metals, a first portion of the layer between the first contact structure and the gate dielectric; and forming a second contact structure on the layer, the second contact structure including one or more metals, a second portion of the layer between the second contact structure and the gate dielectric; wherein the first portion of the layer has a first thickness, the second portion of the layer has a second thickness, and a third portion of the layer between the first and second portions of the layer has a third thickness, the third thickness at least 10 nanometers (nm) greater than one or both of the first thickness or the second thickness.

Example 43 includes the subject matter of Example 42, wherein prior to forming the first contact structure, the first portion of the layer is thinned to the first thickness via etch processing.

Example 44 includes the subject matter of Example 42 or 43, wherein prior to forming the first contact structure, the second portion of the layer is thinned to the second thickness via etch processing.

Example 45 includes the subject matter of Example 43 or 44, wherein the etch processing includes a timed etch.

Example 46 includes the subject matter of Example 43 or 44, wherein the etch processing includes a selective etch that removes one or more sub-layers of the layer.

Example 47 includes the subject matter of any of Examples 42-46, wherein the first portion of the layer is formed to the first thickness and the second portion of the layer is formed to the second thickness through respective contact trenches in which the first contact structure and the second contact structure reside.

Example 48 includes the subject matter of any of Examples 42-47, further including introducing oxygen vacancies in a surface of the first portion of the layer and a surface of the second portion of the layer.

Example 49 includes the subject matter of any of Examples 42-48, wherein the transistor is formed at a back-end-of-line integrated circuit location.

Example 50 includes the subject matter of any of Examples 42-48, wherein the transistor is formed at a front-end-of-line integrated circuit location.

Example 51 includes the subject matter of any of Examples 42-50, wherein the layer is above the gate dielectric.

Example 52 includes the subject matter of any of Examples 42-51, wherein the one or more metals included in the layer includes at least one of indium, gallium, or zinc.

Example 53 includes the subject matter of any of Examples 42-52, wherein the one or more metals included in the layer includes indium, gallium, and zinc.

Example 54 includes the subject matter of any of Examples 42-53, wherein the gate dielectric includes hafnium and oxygen.

Example 55 includes the subject matter of any of Examples 42-54, wherein one or both of the first thickness or the second thickness is at most 5 nm.

Example 56 includes the subject matter of any of Examples 42-55, wherein the third thickness is at least 10 nm greater than both the first thickness and the second thickness.

Example 57 includes the subject matter of any of Examples 42-56, wherein the first contact structure and the second contact structure are above the gate electrode, such that the first contact structure and the gate electrode share a first common vertical plane, and the second contact structure and the gate electrode share a second common vertical plane different from the first common vertical plane.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. A transistor comprising:

a gate electrode including one or more metals;

a gate dielectric on the gate electrode;

a layer on the gate dielectric, the layer including one or more metals, the layer also including oxygen;

a first contact structure on the layer, the first contact structure including one or more metals, a first portion of the layer between the first contact structure and the gate dielectric; and a second contact structure on the layer, the second contact structure including one or more metals, a second portion of the layer between the second contact structure and the gate dielectric, wherein the first portion of the layer has a first thickness, the second portion of the layer has a second thickness, and a third portion of the layer between the first and second portions of the layer has a third thickness, the third thickness greater than the first thickness, and the third thickness the same as the second thickness.

2. The transistor of claim 1, wherein the first contact structure is a source contact structure, and the second contact structure is a drain contact structure.

3. The transistor of claim 1, wherein the first contact structure is a drain contact structure, and the second contact structure is a source contact structure.

4. The transistor of claim 1, wherein the one or more metals included in the layer includes at least one of indium, gallium, or zinc.

5. The transistor of claim 1, wherein the one or more metals included in the layer includes indium, gallium, and zinc.

6. The transistor of claim 1, wherein the gate dielectric includes one or more high-k dielectric materials.

7. The transistor of claim 1, wherein the gate dielectric includes hafnium and oxygen.

8. The transistor of claim 1, wherein the gate dielectric includes one or both of silicon dioxide or low-k dielectric material.

9. The transistor of claim 1, wherein the gate dielectric includes a thickness between the gate electrode and the layer of at least 5 nm.

10. The transistor of claim 1, wherein one or both of the first thickness or the second thickness is at most 10 nm.

11. The transistor of claim 1, further comprising:

an additional gate dielectric on a side of the layer opposite the gate dielectric; and an additional gate electrode on the additional gate dielectric, the additional gate electrode including one or more metals.

12. The transistor of claim 1, wherein the one or more metals and the oxygen included in the layer are included throughout the entirety of the layer.

13. The transistor of claim 1, wherein the layer is a multilayer structure including at least two compositionally different sub-layers, individual sub-layers including one or more metals, individual sub-layers also including oxygen.

14. The transistor of claim 13, wherein the third portion of the layer includes at least one sub-layer that is absent in the first and second portions of the layer.

15. The transistor of claim 1, wherein at least one material included in the third portion of the layer increases in content along the third thickness.

16. The transistor of claim 1, wherein one or both of the first contact structure or the second contact structure extends past an end of the layer.

17. The transistor of claim 1, wherein the first contact structure and the second contact structure are above the gate electrode.

18. A computing device, comprising:

a board; and a component coupled to the board, the component comprising an integrated circuit structure, the integrated circuit structure, comprising:

a gate electrode including one or more metals;

a gate dielectric on the gate electrode;

a layer on the gate dielectric, the layer including one or more metals, the layer also including oxygen;

a first contact structure on the layer, the first contact structure including one or more metals, a first portion of the layer between the first contact structure and the gate dielectric; and a second contact structure on the layer, the second contact structure including one or more metals, a second portion of the layer between the second contact structure and the gate dielectric, wherein the first portion of the layer has a first thickness, the second portion of the layer has a second thickness, and a third portion of the layer between the first and second portions of the layer has a third thickness, the third thickness greater than the first thickness, and the third thickness the same as the second thickness.

19. The system of claim 18, further comprising a memory coupled to the board.

20. The system of claim 18, further comprising a battery coupled to the board.

* * * * *